United States Patent

Sawyer et al.

[15] 3,702,429

[45] Nov. 7, 1972

[54] CYCLOCONVERTER SILICON CONTROLLED RECTIFIER GATE-CATHODE CIRCUIT SIGNAL AND POWER SYSTEM

[72] Inventors: Elbert M. Sawyer, Torrance, Calif.; Joseph M. Brown; Curtis D. Munden, both of Anderson, Ind.; Kenneth E. Giles, Corvallis, Oreg.

[73] Assignee: General Motors Corporation, Detroit, Mich.

[22] Filed: Nov. 30, 1971

[21] Appl. No.: 203,276

[52] U.S. Cl. ....................318/227, 318/230, 318/231

[51] Int. Cl. ...............................................H02p 5/40

[58] Field of Search......318/225, 227, 230, 231, 138, 318/254; 321/7

[56] References Cited

UNITED STATES PATENTS

| | | | |
|---|---|---|---|
| 3,636,423 | 1/1972 | Jenkins | 318/227 |
| 3,659,168 | 4/1972 | Salihi et al. | 318/231 X |

*Primary Examiner*—Gene Z. Rubinson
*Attorney*—Eugene W. Christen et al.

[57] ABSTRACT

A system for producing properly timed gate signals and gate-cathode power for the silicon controlled rectifiers of a cycloconverter network, through which the phase windings of a three-phase alternating current motor are cyclically energized from an alternating current supply potential alternator, having two groups of three silicon controlled rectifiers for each motor phase winding. The properly timed gate signals are produced by a rotor position sensor including six circumferentially arranged phototransistors, each of which corresponds to a group of cycloconverter silicon controlled rectifiers, an axially aligned and spaced light-emitting diode corresponding to each phototransistor, a shutter disposed therebetween and rotated by the motor rotor of a configuration such that pairs of phototransistors are alternately exposed to and masked from the corresponding light-emitting diodes and three gate signal light-emitting diodes connected in series with each phototransistor across a direct current potential source. When any pair of phototransistors is exposed to the corresponding light-emitting diodes, a circuit is completed for the three gate signal light-emitting diodes in series with each. Each gate signal light-emitting diode produces a gate signal for a respective silicon controlled rectifier of the group to which the phototransistor with which it is connected in series corresponds. The gate-cathode circuit of each cycloconverter silicon controlled rectifier of each group is transformer coupled to a different phase output winding of a gate power three-phase alternating current alternator, mechanically coupled to and operated by the alternating current supply potential alternator, which produces a gate-cathode power potential which leads the alternating current supply potential alternator potential by a selected electrical angle. Included in each cycloconverter silicon controlled rectifier gate-cathode circuit are a light actuated silicon controlled rectifier, optically coupled to a corresponding gate signal light-emitting diode, and a gate-cathode circuit silicon controlled rectifier which are triggered conductive, respectively, by the light emitted by the corresponding gate signal light-emitting diode and the output signal of a zero crossover switch in the same gate-cathode circuit to complete the gate-cathode circuit for the corresponding cycloconverter silicon controlled rectifier.

5 Claims, 6 Drawing Figures

United States Patent
Sawyer et al.
[15] 3,702,429
[45] Nov. 7, 1972
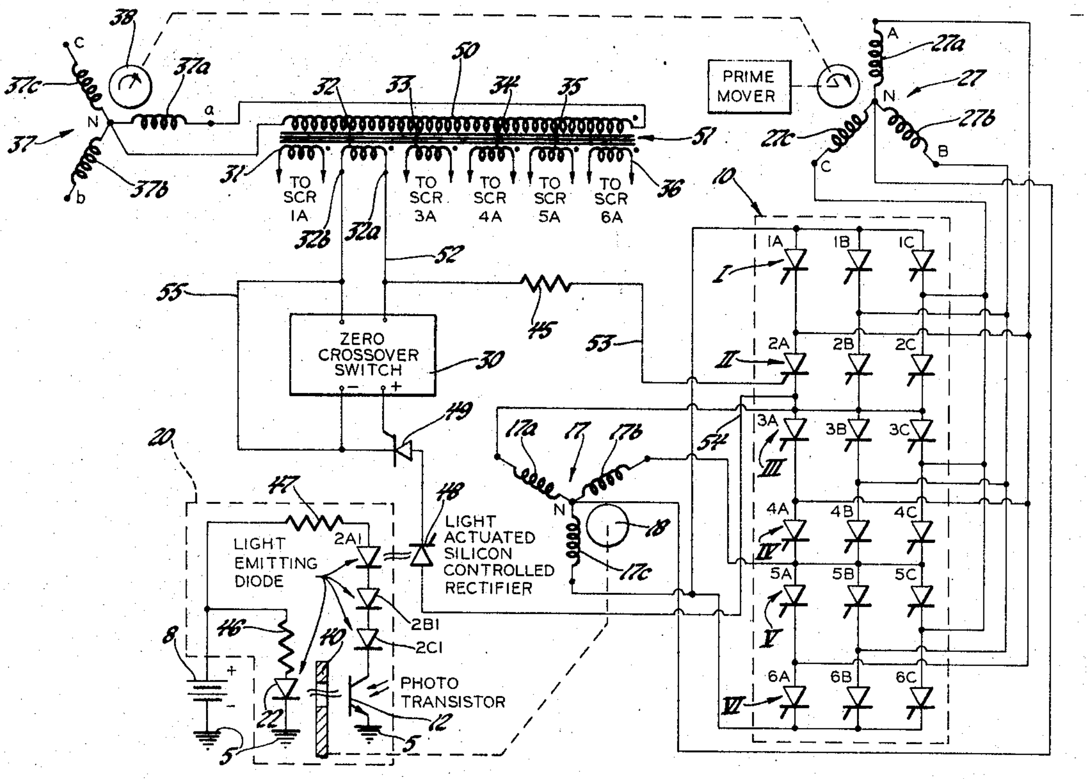

INVENTORS
Elbert M. Sawyer,
Joseph M. Brown,
Curtis D. Munden &
Kenneth E. Giles BY Richard G. Stahr
ATTORNEY

PATENTED NOV 7 1972 3,702,429

INVENTORS
Elbert M. Sawyer,
Joseph M. Brown,
Curtis D. Munden &
BY Kenneth E. Giles
Richard G. Stahr
ATTORNEY INVENTORS
Elbert M. Sawyer,
Joseph M. Brown,
Curtis D. Munden &
BY Kenneth E. Giles
Richard G. Stahr
ATTORNEY

CYCLOCONVERTER SILICON CONTROLLED RECTIFIER GATE-CATHODE CIRCUIT SIGNAL AND POWER SYSTEM

This invention herein described and claimed was made in the course of work under a contract or subcontract thereunder with the Department of Defense.

This invention is directed to a cycloconverter silicon controlled rectifier gate-cathode circuit signal and power system for providing properly timed gate signals and gate-cathode power for the silicon controlled rectifiers of a cycloconverter network through which the phase windings of an alternating current motor are cyclically energized and, more specifically, to a cycloconverter silicon controlled rectifier gate-cathode circuit signal and power system wherein the properly timed gate signals are produced by a motor rotor position sensor of the optical type and the gate-cathode circuit power is produced by a gate power alternating current alternator which produces a potential which leads the supply potential by a selected electrical angle.

To provide for the variable speed operation of an alternating current motor without varying the frequency of the supply potential or changing the number of poles produced by the stator windings, a cycloconverter system comprised of a network of silicon controlled rectifiers which cyclically energize the phase windings of the motor at the proper time with respect to the rotor position may be employed. The cycloconverter silicon controlled rectifiers are normally connected in a network of one or more groups between an alternating current supply potential source and the motor phase windings. In cycloconverter systems for cyclically energizing the phase windings of an alternating current motor from an alternating current supply potential source, each phase of the supply potential source supplies current to each phase winding of the motor in a first direction through a cycloconverter silicon controlled rectifier and in a second opposite direction through another oppositely poled cycloconverter silicon controlled rectifier. Consequently, for each phase of the alternating current supply potential source, there is a corresponding cycloconverter silicon controlled rectifier having the cathode electrode connected to one terminal end of each phase winding of the motor through which current is supplied thereto in a first direction and a corresponding cycloconverter silicon controlled rectifier having the anode electrode connected to the same terminal end of each phase winding of the motor through which current is supplied thereto in a second opposite direction. For example, with a three-phase cycloconverter system in which a three-phase alternating current motor is supplied from a three-phase supply potential source, the cathode electrode of each of three cycloconverter silicon controlled rectifiers, generally termed the common cathode group, and the anode electrode of each of three other cycloconverter silicon controlled rectifiers, generally termed the common anode group, are connected to the same terminal end of each phase winding of the motor. In operation, the gate-cathode power is applied simultaneously across and removed from the gate-cathode electrodes of all of the cycloconverter silicon controlled rectifiers of each group. Pairs of cycloconverter silicon controlled rectifier groups may be gated conductive in a switching sequence in response to gate signals produced by a rotor position sensor.

One example of an alternating current motor which may be used with the cycloconverter silicon controlled rectifier gate-cathode circuit signal and power system of this invention is disclosed and described in U.S. Pat. No. 3,297,926, Campbell et al., which issued Jan. 10, 1967 and is assigned to the same assignee as is this application.

It is an object of this invention to provide an improved cycloconverter silicon controlled rectifier gate-cathode circuit signal and power system.

It is another object of this invention to provide an improved cycloconverter silicon controlled rectifier gate-cathode circuit signal and power system wherein the gate signals for the cycloconverter silicon controlled rectifiers are produced by a motor rotor position sensor of the optical type.

It is a further object of this invention to provide an improved cycloconverter silicon controlled rectifier gate-cathode circuit signal and power system wherein the gate-cathode power for the cycloconverter silicon controlled rectifiers is supplied by a gate power alternating current alternator which produces a gate-cathode power potential which leads the supply potential by a selected electrical angle.

It is a further object of this invention to provide an improved cycloconverter silicon controlled rectifier gate-cathode circuit signal and power system wherein the gate-cathode circuits of the cycloconverter silicon controlled rectifiers are optically coupled to the rotor position sensor.

In accordance with this invention, a cycloconverter silicon controlled rectifier gate-cathode circuit signal and power system is provided wherein the gate-cathode circuit of each cycloconverter silicon controlled rectifier of each silicon controlled rectifier group of the cycloconverter network is transformer coupled to a respective different phase output winding of a gate power alternating current alternator which produces a gate-cathode power potential which leads the supply potential by a selected electrical angle, and includes a light actuated silicon controlled rectifier optically coupled to a corresponding gate signal light-emitting diode included in an optical type rotor position sensor, a zero crossover switch which produces an output signal as the gate power alternating current potential passes from a negative to a positive polarity and a gate-cathode circuit silicon controlled rectifier switch responsive to the output signal produced by the crossover switch for completing the gate-cathode circuit for the corresponding silicon controlled rectifier.

For a better understanding of the present invention, together with additional objects, advantages and features thereof, reference is made to the following description and accompanying drawings in which.

Figure 5:
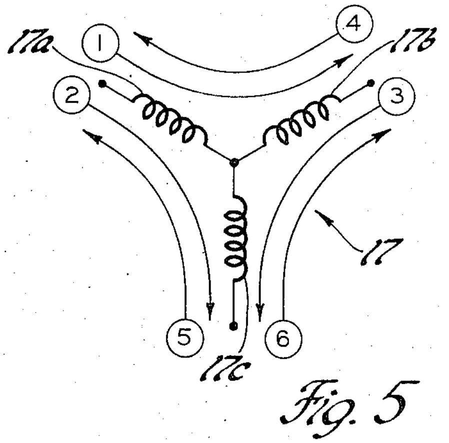
Figure 6:
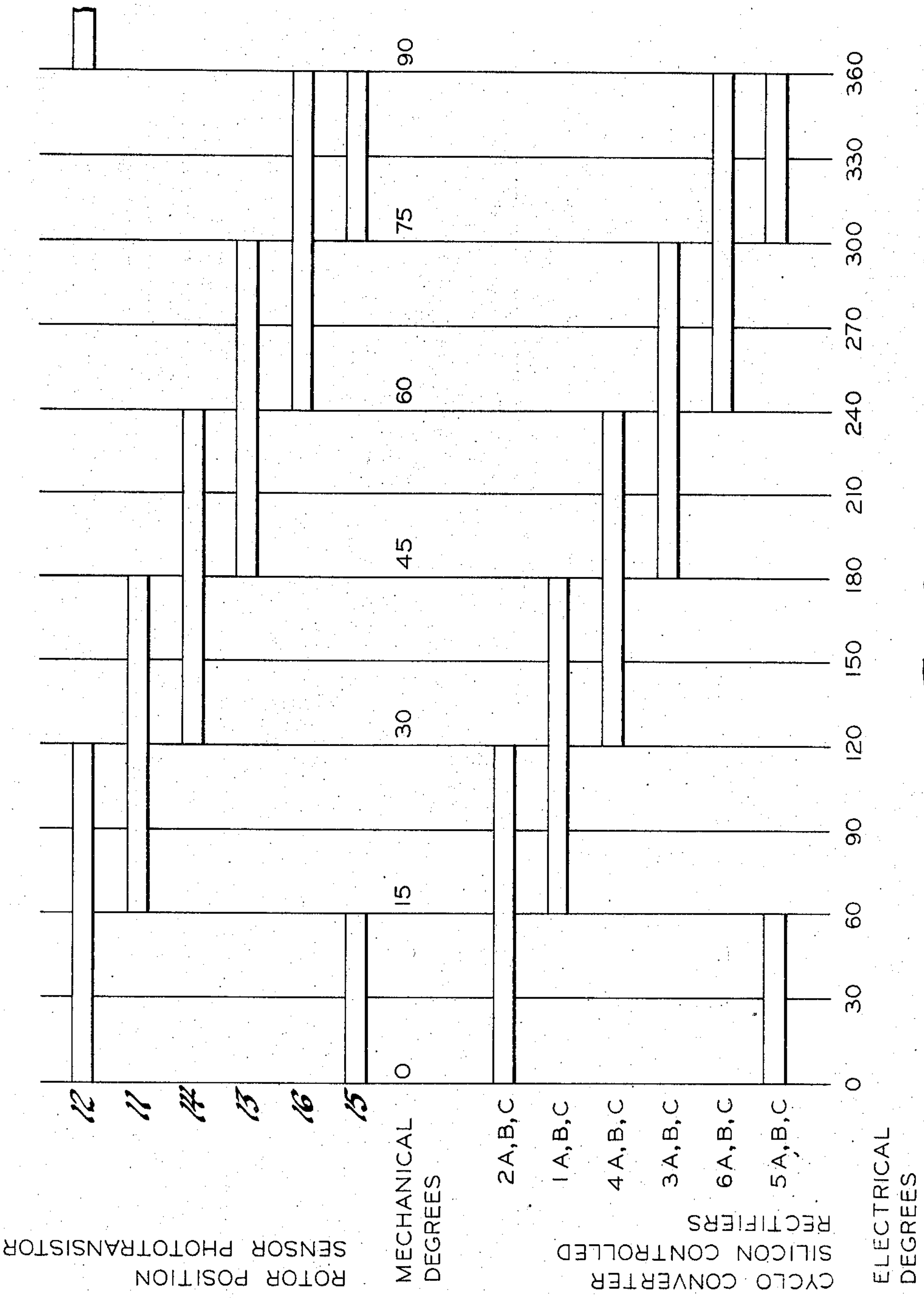

FIG. 5 schematically represents the periods of motor phase winding energization for 360 electrical degrees of motor energization, and FIG. 6 is a diagrammatical representation of the periods of motor phase winding energization.

Figure 1:
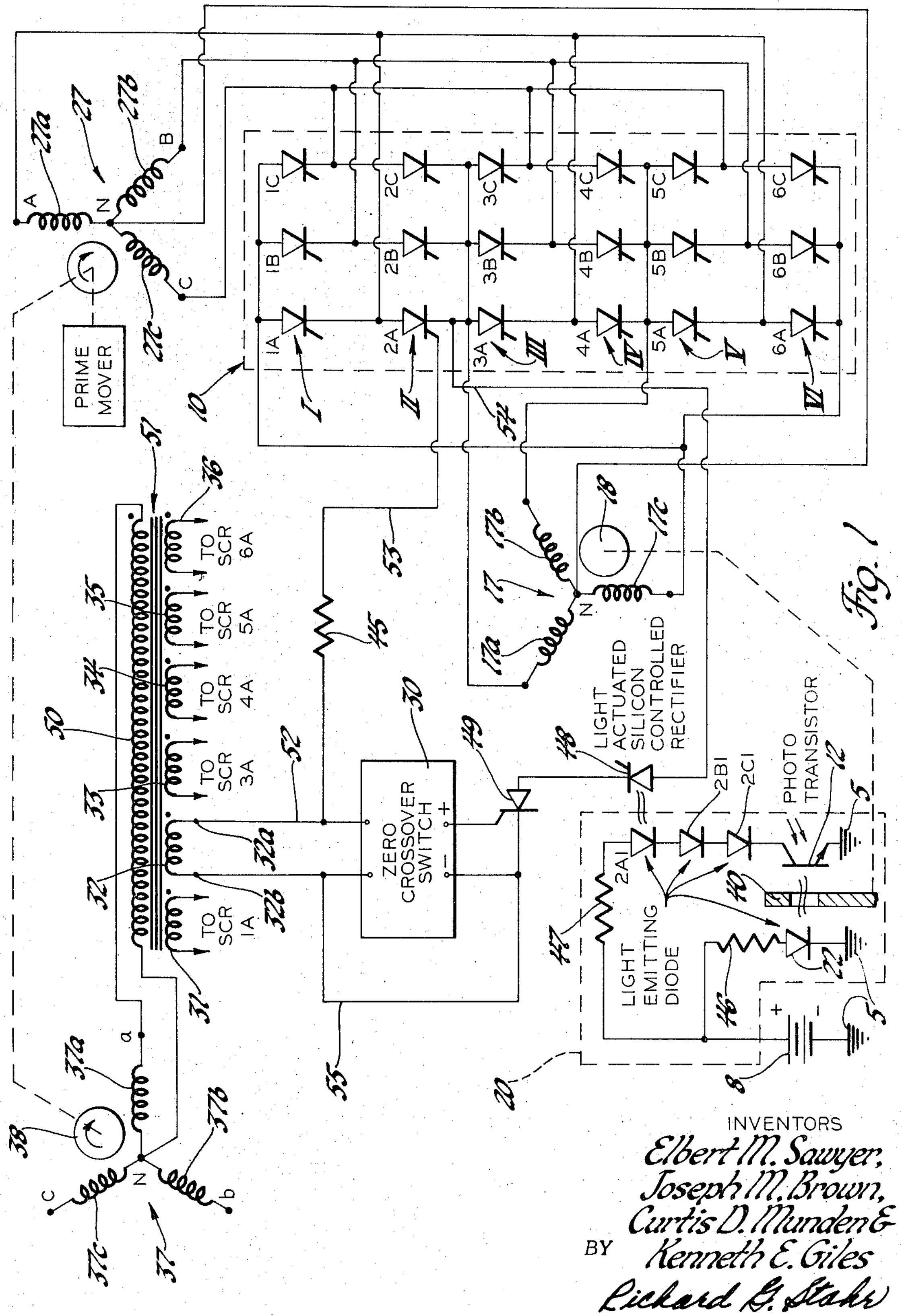
FIG. 1 is a schematic diagram of the cycloconverter silicon controlled rectifier gate-cathode signal and power supply system of this invention.

As point of reference or ground potential is the same point electrically throughout the system, it has been illustrated in FIG. 1 by the accepted schematic symbol and referenced by the numeral 5.

Referring to FIG. 1, the cycloconverter silicon controlled rectifier gate-cathode circuit signal and power system of this invention is set forth in schematic form in combination with an alternating current motor 17 having polyphase field windings and a rotatable rotor 18; a supply potential alternating current alternator 27 having a phase output winding for each motor field winding; a cycloconverter network 10 of silicon controlled rectifiers, each having anode, cathode and gate electrodes, of the type having two silicon controlled rectifier groups corresponding to each phase winding of the motor 17 for cyclically energizing the phase windings of the motor 17 from the phase output windings of the supply potential alternator 27 and a source of direct current potential, which may be a conventional battery 8, and includes a rotor position sensor 20 for producing cycloconverter silicon controlled rectifier gate signals and a gate power alternating current alternator 37 having the same number of phase output windings as and a rotor 38 mechanically coupled to the supply potential alternating current alternator 27 for producing a cycloconverter silicon controlled rectifier gate-cathode power potential which leads the supply potential by a selected electrical angle.

Each of the cycloconverter silicon controlled rectifiers has a gate-cathode circuit through which gate-cathode power is applied. In the interest of reducing drawing complexity and since the gate-cathode circuit for each of the cycloconverter silicon controlled rectifiers is identical to every other, only the gate-cathode circuit for cycloconverter silicon controlled rectifier 2A has been set forth in detail in FIG. 1. The gate-cathode circuit for each one of the cycloconverter silicon controlled rectifiers includes a zero crossover switch 30 of the type which produces an output signal upon each transition of an input alternating current signal through zero from a negative to a positive polarity and first and second switch devices responsive to the cycloconverter silicon controlled rectifier gate signals produced by the rotor position sensor and to the output signal from the zero crossover switch in the same gate-cathode circuit, respectively, for completing the gate-cathode circuit for the corresponding cycloconverter silicon controlled rectifier.

As the alternating current motor 17 is illustrated in FIG. 1 as a three-phase motor having three wye connected phase windings 17*a*, 17*b* and 17*c*, the supply potential alternating current alternator also has three wye connected phase output windings 27*a*, 27*b* and 27*c*. The cycloconverter network 10 has two silicon controlled rectifier groups corresponding to each phase winding of the motor 17 for cyclically energizing the phase windings of the motor 17 from the phase output windings of the supply potential alternator 27. That is, cycloconverter silicon controlled rectifier Groups I and VI correspond to motor phase winding 17*c*, cycloconverter silicon controlled rectifier Groups II and III correspond to motor phase winding 17*a* and cycloconverter silicon controlled rectifier Groups IV and V correspond to motor phase winding 17*b* . Phase output winding 27*a* of supply potential alternator 27 is connected to the junction between cycloconverter silicon controlled rectifiers 1A and 2A, 3A and 4A, and 5A and 6A; phase output winding 27*b* of supply potential alternator 27 is connected to the junction between cycloconverter silicon controlled rectifiers 1B and 2B, 3B and 4B, and 5B and 6B; and phase output winding 27*c* of supply potential alternator 27 is connected to the junction between cycloconverter silicon controlled rectifiers 1C and 2C, 3C and 4C, and 5C and 6C. Consequently, energizing current is supplied in a first direction for motor phase winding 17*a* through the conducting cycloconverter silicon controlled rectifier of common cathode Group II for phase winding 17*b* through the conducting cycloconverter silicon controlled rectifier of common cathode Group IV and for motor phase winding 17*c* through the conducting cycloconverter silicon controlled rectifier of common cathode Group VI and in a second direction for motor phase winding 17*a* through the conducting cycloconverter silicon controlled rectifier of common anode Group III, for motor phase winding 17*b* through the conducting cycloconverter silicon controlled rectifier of common anode Group V and for motor phase winding 17*c* through the conducting cycloconverter silicon controlled rectifier of common anode Group I. The cycloconverter network 10 effectively forms a frequency converter circuit that corresponds to a three-phase full wave rectifier. The silicon controlled rectifiers of the respective groups are selectively switched ON in conductive pairs to produce positive and negative motor input voltage power pulses in a basic three-phase sequence, as will be explained in detail later in this specification.

Figure 2:
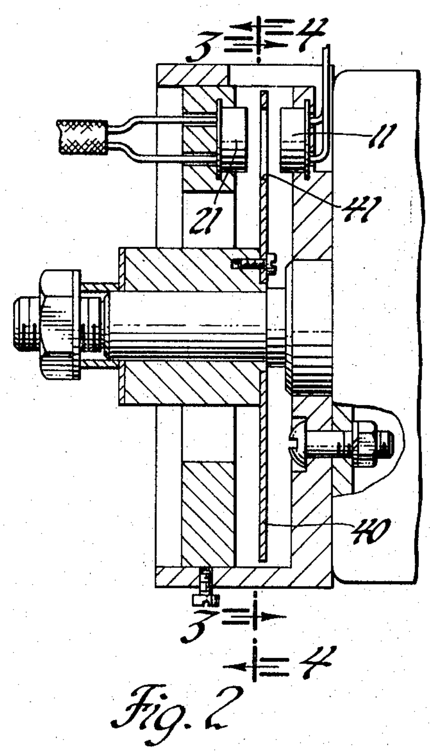
FIG. 2 illustrates, in cross-section, an optical type motor rotor position sensor suitable for use with the cycloconverter silicon controlled rectifier gate-cathode circuit signal and power system of this invention.
Figure 3:
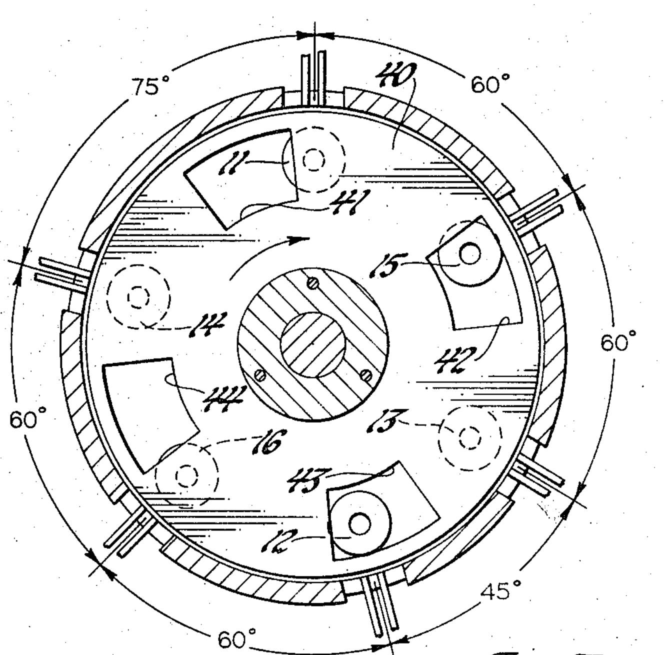
FIG. 3 is a section view of FIG. 2 taken along line 3—3 and looking in the direction of the arrows.
Figure 4:
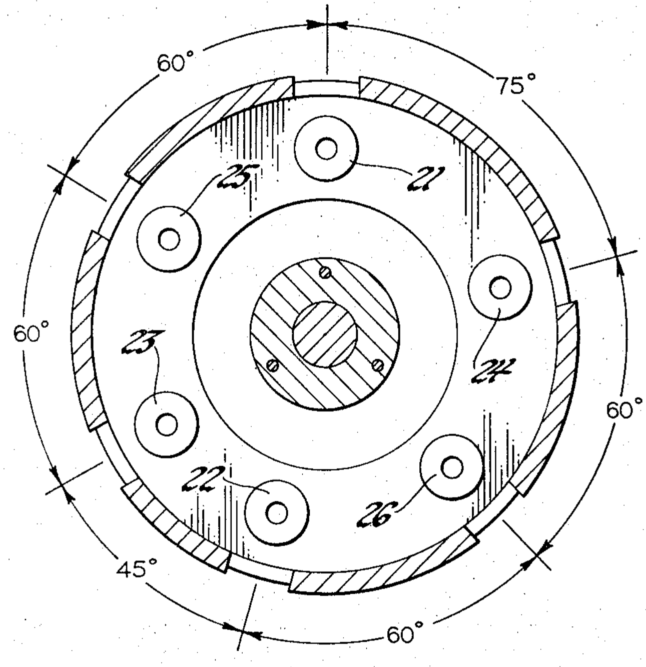
FIG. 4 is a section view of FIG. 2 taken along line 4—4 and looking in the direction of the arrows.

A rotor position sensor for producing cycloconverter silicon controlled rectifier gate signals is set forth in FIGS. 2, 3 and 4 and includes a plurality of rotor position sensor phototransistors, referenced by the numerals 11 through 16 in FIG. 3, each corresponding to one of the cycloconverter silicon controlled rectifier groups of the cycloconverter network, a rotor position sensor light-emitting diode, referenced by the numerals 21 through 26 in FIG. 4, and a shutter member 40 operated by the rotor 18 of motor 17. FIGS. 2, 3, and 4 illustrate a rotor position sensor for an eight-pole motor. The rotor position sensor phototransistors are circumferentially arranged, as indicated in FIG. 3, and each rotor position sensor light-emitting diode is axially aligned in optical coupling relationship with each corresponding one of the rotor position sensor phototransistors as shown in FIG. 2. Each of the rotor position sensor light-emitting diodes is connected across the source of direct current potential 8, as shown in FIG. 1, for rotor position sensor light-emitting diode 22 which is connected across the positive and negative polarity terminals of battery 8 through a current limiting resistor 46 and point of reference or ground potential 5. It is to be specifically understood that each of the other rotor position sensor light-emitting diodes are similarly connected across battery 8. Shutter member 40 is disposed between the rotor position sensor phototransistors and the rotor position sensor lighttemitting diodes, as shown in FIG. 2, and is of a configuration such that pairs of rotor position sensor phototransistors are alternately exposed to and masked from the corresponding rotor position sensor light-emitting diodes. For an eight-pole motor, the rotor position sensors are spaced as shown in FIG. 3 and shutter member 40 may have a plurality of equally spaced and circumferentially arranged apertures 41, 42, 43 and 44. It is to be specifically understood that shutter member 40 may be of any other configuration which alternately exposes and masks the rotor position sensor phototransistors to and from the corresponding rotor position sensor light-emitting diodes.

To produce the cycloconverter silicon controlled rectifier gate signals, a gate signal light-emitting diode corresponding to each cycloconverter silicon controlled rectifier of the cycloconverter network is employed. Each rotor position sensor phototransistor and the gate signal light-emitting diodes which correspond to the cycloconverter silicon controlled rectifiers of the silicon controlled rectifier group of the cycloconverter network to which the rotor position sensor phototransistor corresponds are connected in series across the source of direct current potential, battery 8. In FIG. 1, gate signal light-emitting diodes 2A1, 2B1, and 2C1, which correspond to cycloconverter silicon controlled rectifiers 2A, 2B, and 2C of the cycloconverter silicon controlled rectifier common cathode Group II, are shown to be connected in series with rotor position sensor phototransistor 12, which corresponds to cycloconverter silicon controlled rectifier Group II, across the positive and negative polarity terminals of battery 8 through a current limiting resistor 47 and point of reference or ground potential 5. The gate signal light-emitting diodes corresponding to cycloconverter silicon controlled rectifiers 1A, 1B, and 1C of Group I, the gate signal light-emitting diodes corresponding to cycloconverter silicon controlled rectifiers 3A, 3B and 3C of Group III, the gate signal light-emitting diodes corresponding to cycloconverter silicon controlled rectifiers 4A, 4B and 4C of Group IV, the gate signal light-emitting diodes corresponding to cycloconverter silicon controlled rectifiers 5A, 5B, and 5C of Group V and the gate signal light-emitting diodes corresponding to cycloconverter silicon controlled rectifiers 6A, 6B and 6C of Group VI are similarly connected in series with respective rotor position sensor phototransistors 11, 13, 14, 15 and 16 across battery 8.

A gate-cathode circuit is provided for each one of the cycloconverter silicon controlled rectifiers which includes a light actuated silicon controlled rectifier having two current carrying electrodes connected in series and optically coupled to the one of the gate signal light-emitting diodes which corresponds to the same cycloconverter silicon controlled rectifier, a zero crossover switch of the type which produces an output signal upon each transition of an input alternating current signal through zero from a negative to a positive polarity and a gate-cathode circuit silicon controlled rectifier switch having two current carrying electrodes connected in series responsive to the output signal from the zero crossover switch in the same gate-cathode circuit for completing the gate-cathode circuit for the corresponding cycloconverter silicon controlled rectifier.

As the zero crossover switch used with the cycloconverter silicon controlled rectifier gate-cathode signal and power system of this invention may be any one of the several commercially available zero crossover switches well known in the art and, since the crossover switch, per se, forms no part of this invention, it has been illustrated in FIG. 1 in block form. One example of a zero crossover switch suitable for use with the system of this invention is commercially available from RCA under catalog No. CA-3059.

Referring to FIG. 1 in which the gate-cathode circuit for cycloconverter silicon controlled rectifier 2A is set forth in detail, the current carrying electrodes of light actuated silicon controlled rectifier 48, optically coupled to the gate signal light-emitting diode 2A1 which corresponds to cycloconverter silicon controlled rectifier 2A, zero crossover switch 30, the current carrying electrodes of gate-cathode circuit silicon controlled rectifier 49, responsive to the output signal from zero crossover switch 30, and current limiting resistor 45 are shown to be connected in series across the gate-cathode electrodes of cycloconverter silicon controlled rectifier 2A. It is to be specifically understood that the gate-cathode circuit of each of the other cycloconverter silicon controlled rectifiers of the cycloconverter network include the same elements connected in an identical manner.

The gate-cathode circuit of each of the cycloconverter silicon controlled rectifiers of each of the silicon controlled rectifier groups is transformer coupled to a respective different phase output winding of the gate power alternating current alternator 37. In FIG. 1, the primary winding 50 of a transformer 51 is shown to be connected across the terminal end of output phase winding 37*a* of the gate power alternating current alternator 37 and neutral point N. Primary winding 50 is magnetically coupled to secondary windings 31, 32, 33, 34, 35 and 36, each corresponding to a cycloconverter silicon controlled rectifier group of the cycloconverter network. The gate-cathode circuit of cycloconverter silicon controlled rectifier 2A is transformer coupled to the output phase winding 37a of gate power alternating current alternator 37 through secondary winding 32 of transformer 51 and the gate-cathode circuit of each of cycloconverter silicon controlled rectifiers 1A, 3A, 4A, 5A, and 6A are similarly transformed coupled to output phase winding 37a through respective secondary windings 31, 33, 34, 35, and 36 of transformer 51. The primary winding of a similar transformer is connected across the terminal end of each of output phase windings 37*b* and 37 *c* of gate power alternating current alternator 37 and neutral point N and the gate-cathode circuits of cycloconverter silicon controlled rectifiers 1B, 2B, 3B, 4B, 5B, and 6B are similarly coupled to one through respective secondary windings and the gate-cathode circuits of cycloconverter silicon controlled rectifiers 1C, 2C, 3C, 4C, 5C and 6C are similarly coupled to the other through respective secondary windings. In the interest of reducing drawing complexity, the coupling transformers for phase output windings 37*b* and 37*c* of gate power alternating current alternator 37 have not been shown in FIG. 1.

To operate motor 17 from alternating current supply potential alternator 27 through the cycloconverter network 10 of silicon controlled rectifiers, the phase windings thereof may be cyclically energized in the manner as illustrated in FIG. 5 wherein motor phase winding energizing current is illustrated by elongated arrows for six sequential periods which complete 360 electrical degrees of motor energization. During the first period, motor phase windings 17*a* and 17*b* are energized by a motor phase winding energizing current flowing into phase winding 17*a* and out of phase winding 17*b;* during the second period, motor phase windings 17*a* and 17*c* are energized by a motor phase winding energizing current flowing into phase winding 17*a* and out of phase winding 17*c;* during the third period, motor phase windings 17*b* and 17*c* are energized by a motor phase winding energizing current flowing into phase winding 17*b* and out of phase winding 17*c;* during the fourth period, motor phase windings 17*b* and 17*a* are energized by a motor phase winding energizing current flowing into phase winding 17*b* and out of phase winding 17*a;* during the fifth period, motor phase windings 17*c* and 17*a* are energized by a motor phase winding energizing current flowing into phase winding 17*c* and out of phase winding 17*a* and during the sixth period, motor phase windings 17*c* and 17*b* are energized by a motor phase winding energizing current flowing into phase winding 17*c* and out of phase winding 17*b*. This completes 360 electrical degrees of motor energization as, during the next period, motor phase windings 17*a* and 17*b* are again energized by a motor phase winding energizing current flowing into phase winding 17*a* and out of phase winding 17*b*.

With reference to FIG. 1 of the drawing, during the first period of motor phase winding energization, cycloconverter silicon controlled rectifiers 2A, 2B, and 2C of common cathode Group II and cycloconverter silicon controlled rectifiers 5A, 5B and 5C of common anode Group V are gated "ON" to supply motor phase winding energizing current into phase winding 17a and out of phase winding 17b; during the second period, cycloconverter silicon controlled rectifiers 2A, 2B and 2C of common cathode Group II and cycloconverter silicon controlled rectifiers 1A, 1B and 1C of common anode Group I are gated "ON" to supply motor phase winding energizing current into phase winding 17*a* and out of phase winding 17*c;* during the third period, cycloconverter silicon controlled rectifiers 4A, 4B and 4C of common cathode Group IV and cycloconverter silicon controlled rectifiers 1A, 1B and 1C of common anode Group I are gated "ON" to supply motor phase winding energizing current into phase winding 17*b* and out of phase winding 17*c;* during the fourth period, cycloconverter silicon controlled rectifiers 4A, 4B and 4C of common cathode Group IV and cycloconverter silicon controlled rectifiers 3A, 3B and 3C of common anode Group III are gated "ON" to supply motor phase winding energizing current into phase winding 17*b* and out of phase winding 17*a;* during the fifth period, cycloconverter silicon controlled rectifiers 6A, 6B and 6C of common cathode Group VI and cycloconverter silicon controlled rectifiers 3A, 3B and 3C of common cathode Group III are gated "ON" to supply motor phase winding energizing current into phase winding 17*c* and out of phase winding 17*a* and during the sixth period, cycloconverter silicon controlled rectifiers 6A, 6B and 6C of common cathode Group VI and cycloconverter silicon controlled rectifiers 5A, 5B and 5C of common anode Group V are gated "ON" to supply motor phase winding energizing current into phase winding 17c and out of phase winding 17b to complete 360 electrical degrees of motor energization. Consequently, the rotor position sensor must be so arranged as to produce cycloconverter silicon controlled rectifier gate signals for the six Groups in the sequence of II, I, IV, III, VI, V.

Referring to FIGS. 2, 3 and 4 which set forth the rotor position sensor and assuming that supply potential alternating current alternator 27 and gate power alternating current alternator 37 are operating and motor 17 is at rest, rotor position sensor phototransistors 12 and 15 are exposed to the corresponding rotor position sensor light-emitting diodes 22 and 25 through respective apertures 43 and 42 of rotor member 40. As rotor position sensor phototransistors 12 and 15 are illuminated by the corresponding rotor position sensor light-emitting diodes 22 and 25, these devices conduct through the current carrying electrodes thereof to complete an energizing circuit across the source of direct current potential 8 for each the three gate signal light-emitting diodes 2A1, 2B1 and 2C1, which correspond to cycloconverter silicon controlled rectifiers 2A, 2B and 2C, connected in series with rotor position sensor phototransistor 12 and the three gate signal light-emitting diodes, not shown, which correspond to cycloconverter silicon controlled rectifiers 5A, 5B and 5C, connected in series with rotor position sensor phototransistor 15. Each of these six energized gate signal light-emitting diodes illuminates the corresponding light actuated silicon controlled rectifier of the gate-cathode circuit of the cycloconverter silicon controlled rectifier to which it corresponds to condition each respective gate-cathode circuit for completion.

With the light actuated silicon controlled rectifier included in the gate-cathode circuit of each of cycloconverter silicon controlled rectifiers 2A, 2B and 2C of common cathode Group II and 5A, 5B, and 5C of common anode Group V illuminated by the gate signal light-emitting diode to which it corresponds, each of these gate-cathode circuits is conditioned for completion upon the next transition of the gate-cathode power potential produced by gate power alternating current alternator 37 upon the terminal ends of respective phase output windings 37*a*, 37*b* and 37*c* through zero from a negative to a positive polarity with respect to neutral point N. At the time of each transition of the gate-cathode power potential, the zero crossover switch included in each gate-cathode circuit magnetically coupled to the gate power alternating current alternator output phase winding in which the transition occurs produces an output signal which triggers the gate-cathode circuit silicon controlled rectifier switch of the same gate-cathode circuit conductive to complete the gate-cathode circuit. For example, gate signal light-emitting diode 2A1 of FIG. 1 illuminates the corresponding light actuated silicon controlled rectifier 48 of the cathode-anode circuit of cycloconverter silicon controlled rectifier 2A to which it corresponds to condition the gate-cathode circuit of cycloconverter silicon controlled rectifier 2A for completion and the gate signal light-emitting diodes 2B1 and 2C1 illuminate the corresponding light actuated silicon controlled rectifiers, not shown, of the gate-cathode circuit of each of cycloconverter silicon controlled rectifiers 2B and 2C to condition the gate-cathode circuit of each of cycloconverter silicon controlled rectifiers 2B and 2C for completion. Upon the next transition of the gate-cathode power potential produced by gate power alternating current alternator 37 upon the terminal end of phase output winding 37*a* through zero from a negative to a positive polarity with respect to neutral point N, zero crossover switch 30 of the gate-cathode circuit of cycloconverter silicon controlled rectifier 2A produces an output signal which is applied across the gate-cathode electrodes of gate-cathode circuit silicon controlled rectifier switch 49. Upon the next transition of the gate-cathode power potential produced by gate power alternating current alternator 37 upon the terminal end of phase output winding 37*b* through zero from a negative to a positive polarity with respect to neutral point N, the zero crossover switch, not shown, of the gate-cathode circuit for cycloconverter silicon controlled rectifier 2B produces an output signal which is applied across the gate-cathode electrodes of the gate-cathode circuit silicon controlled rectifier switch, not shown, of the gate-cathode circuit of cycloconverter silicon controlled rectifier 2B. Upon the next transition of the gate-cathode power potential produced by gate power alternating current alternator 37 upon the terminal end of phase output winding 37*c* through zero from a negative to a positive polarity with respect to neutral point N, the zero crossover switch, not shown, of the gate-cathode circuit for cycloconverter silicon controlled rectifier 2C produces an output signal which is applied across the gate-cathode electrodes of the gate-cathode circuit silicon controlled rectifier switch, not shown, of the gate-cathode circuit of cycloconverter silicon controlled rectifier 2C. The signal produced by each of the gate-cathode circuit silicon controlled rectifier switches triggers the gate-cathode circuit silicon controlled rectifier switch in the same gate-cathode circuit conductive through the anode-cathode electrodes to complete the gate-cathode circuit for the corresponding cycloconverter silicon controlled rectifier. For example, the signal produced by zero crossover switch 30 of the gate-cathode circuit of cycloconverter silicon controlled rectifier 2A triggers gate-cathode circuit silicon controlled rectifier 49 conductive through the anode-cathode electrodes to complete the gate-cathode circuit for cycloconverter silicon controlled rectifier 2A which may be traced from terminal end 32*a* of secondary winding 32 of transformer 51, through lead 52, the anode-cathode electrodes of silicon controlled rectifier 49, current limiting resistor 45, lead 53, the gate-cathode junction of cycloconverter silicon controlled rectifier 2A, lead 54, the anode-cathode electrodes of light actuated silicon controlled rectifier 48 and lead 55 to terminal end 32*b* of secondary winding 32. The gate-cathode circuit of the other cycloconverter silicon controlled rectifiers are similarly completed across the secondary winding of the coupling transformer through which they are coupled to the gate power alternating current alternator 37. As the respective gate-cathode circuits of cycloconverter silicon controlled rectifiers 5A, 5B and 5C are completed simultaneously with the respective gate-cathode circuits of cycloconverter silicon controlled rectifiers 2A, 2B and 2C, respective pairs of cycloconverter silicon controlled rectifiers, one of each group, are successively triggered conductive through which phase windings 17*a* and 17*b* are energized by an energizing current which is supplied through the conducting cycloconverter silicon controlled rectifier of Group II into the terminal end of motor phase winding 17*a* and out of the terminal end of phase winding 17*b* through the conducting cycloconverter silicon controlled rectifier of Group V. Upon the energization of phase windings 17*a* and 17*b*, rotor 18 of motor 17 begins to rotate.

After a few degrees of rotation of rotor 18 in a clockwise direction, as looking at FIG. 3, a rotor position sensor phototransistor 11 becomes exposed to the corresponding rotor position sensor light-emitting diode 21 through aperture 41 of rotor member 40, rotor position sensor phototransistor 15 becomes masked from the corresponding rotor position sensor light-emitting diode 25 and rotor position sensor phototransistor 12 remains exposed to the corresponding rotor position sensor light-emitting diode 22 through aperture 43 of rotor member 40. Consequently, the three gate signal light-emitting diodes 2A1, 2B1 and 2C1 connected in series with rotor position sensor phototransistor 12 across battery 8 remain energized and the three gate signal light-emitting diodes, not shown, corresponding to cycloconverter silicon controlled rectifiers 1A, 1B and 1C connected in series with rotor position sensor phototransistor 11 across battery 8 become energized. Each of these six energized gate signal light-emitting diodes illuminates the corresponding light actuated silicon controlled rectifier of the gate-cathode circuit of the cycloconverter silicon controlled rectifier to which it corresponds to condition each respective gate-cathode circuit for completion. Consequently, respective pairs of cycloconverter silicon controlled rectifiers, one of each of common cathode Group II and common anode Group I, are successively triggered conductive by the gate-cathode power potential, in a manner previously explained, through which phase windings 17*a* and 17*c* are energized by an energizing current which is supplied through the conducting cycloconverter silicon controlled rectifier of Group II into the terminal end of motor phase winding 17*a* and out of the terminal end of phase winding 17*c* through the conducting cycloconverter silicon controlled rectifier of Group I.

After fifteen degrees more of rotation of rotor 18 in a clockwise direction, as looking at FIG. 3, rotor position sensor phototransistor 14 becomes exposed to the corresponding rotor position sensor light-emitting diode 24 through aperture 44 of rotor member 40, rotor position sensor phototransistor 12 becomes masked from the corresponding rotor position sensor light-emitting diode 22 and rotor position sensor phototransistor 11 remains exposed to the corresponding rotor position sensor light-emitting diode 21 through aperture 41 of rotor member 40. Consequently, the three gate signal light-emitting diodes, not shown, connected in series with rotor position sensor phototransistor 11 across battery 8 remain energized and the three gate signal light-emitting diodes, not shown, corresponding to cycloconverter silicon controlled rectifiers 4A, 4B and 4C connected in series with rotor position sensor phototransistor 14 across battery 8 become energized. Each of these six energized gate signal light-emitting diodes illuminates the corresponding light actuated silicon controlled rectifier of the gate-cathode circuit of the cycloconverter silicon controlled rectifier to which it corresponds to condition each respective gate-cathode circuit for completion. Consequently, respective pairs of cycloconverter silicon controlled rectifiers, one of each of common cathode Group IV and common anode Group I, are successively triggered conductive by the gate-cathode power potential, in a manner previously explained, through which phase windings 17*b* and 17*c* are energized by an energizing current which is supplied through the conducting cycloconverter silicon controlled rectifier of Group IV into the terminal end of motor phase winding 17*b* and out of the terminal end of phase winding 17*c* through the conducting cycloconverter silicon controlled rectifier of Group I.

After 15° more of rotation of rotor 18 in a clockwise direction, as looking at FIG. 3, rotor position sensor phototransistor 13 becomes exposed to the corresponding rotor position sensor light-emitting diode 23 through aperture 42 of rotor member 40, rotor position sensor phototransistor 11 becomes masked from the corresponding rotor position sensor light-emitting diode 21 and rotor position sensor phototransistor 14 remains exposed to the corresponding rotor position sensor light-emitting diode 24 through aperture 44 of rotor member 40. Consequently, the three gate signal light-emitting diodes, not shown, connected in series with rotor position sensor phototransistor 14 across battery 8 remain energized and the three gate signal light-emitting diodes, not shown, corresponding to cycloconverter silicon controlled rectifiers 3A, 3B and 3C connected in series with rotor position sensor phototransistor 13 across battery 8 become energized. Each of these six energized gate signal light-emitting diodes illuminates the corresponding light actuated silicon controlled rectifier of the gate-cathode circuit of the cycloconverter silicon controlled rectifier to which it corresponds to condition each respective gate-cathode circuit for completion. Consequently, respective pairs of cycloconverter silicon controlled rectifiers, one of each of common cathode Group IV and common anode Group III, are successively triggered conductive by the gate-cathode power potential, in a manner previously explained, through which phase windings 17b and 17*a* are energized by an energizing current which is supplied through the conducting cycloconverter silicon controlled rectifier of Group IV into the terminal end of motor phase winding 17*b* and out of the terminal end of phase winding 17*a* through the conducting cycloconverter silicon controlled rectifier of Group III.

After 15° more of rotation of rotor 18 in a clockwise direction, as looking at FIG. 3, a rotor position sensor phototransistor 16 becomes exposed to the corresponding rotor position sensor light-emitting diode 26 through aperture 43 of rotor member 40, rotor position sensor phototransistor 14 becomes masked from the corresponding rotor position sensor light-emitting diode 24 and rotor position sensor phototransistor 13 remains exposed to the corresponding rotor position sensor light-emitting diode 22 through aperture 42 of rotor member 40. Consequently, the three gate signal light-emitting diodes, not shown, connected in series with rotor position sensor phototransistor 13 across battery 8 remain energized and the three gate signal light-emitting diodes, not shown, corresponding to cycloconverter silicon controlled rectifiers 6A, 6B and 6C connected in series with rotor position sensor phototransistor 16 across battery 8 become energized. Each of these six energized gate signal light-emitting diodes illuminates the corresponding light actuated silicon controlled rectifier of the gate-cathode circuit of the cycloconverter silicon controlled rectifier to which it corresponds to condition each respective gate-cathode circuit for completion. Consequently, respective pairs of cycloconverter silicon controlled rectifiers, one of each of common cathode Group VI and common anode Group III, are successively triggered conductive by the gate-cathode power potential, in a manner previously explained, through which phase windings 17*c* and 17*a* are energized by an energizing current which is supplied through the conducting cycloconverter silicon controlled rectifier of Group VI into the terminal end of motor phase winding 17*c* and out of the terminal end of phase winding 17*a* through the conducting cycloconverter silicon controlled rectifier of Group III.

After fifteen degrees more of rotation of rotor 18 in a clockwise direction, as looking at FIG. 3, rotor position sensor phototransistor 15 becomes exposed to the corresponding rotor position sensor light-emitting diode 25 through aperture 41 of rotor member 40, rotor position sensor phototransistor 13 becomes masked from the corresponding rotor position sensor light-emitting diode 23 and rotor position sensor phototransistor 16 remains exposed to the corresponding rotor position sensor light-emitting diode 26 through aperture 43 of rotor member 40. Consequently, the three gate signal light-emitting diodes, not shown, connected in series with rotor position sensor phototransistor 16 across battery 8 remain energized and the three gate signal light-emitting diodes, not shown, corresponding to cycloconverter silicon controlled rectifiers 5A, 5B and 5C connected in series with rotor position sensor phototransistor 15 across battery 8 become energized. Each of these six energized gate signal light-emitting diodes illuminates the corresponding light actuated silicon controlled rectifier of the gate-cathode circuit of the cycloconverter silicon controlled rectifier to which it corresponds to condition each respective gate-cathode circuit for completion. Consequently, respective pairs of cycloconverter silicon controlled rectifiers, one of each of common cathode Group VI and common anode Group V, are successively triggered conductive by the gate-cathode power potential, in a manner previously explained, through which phase windings 17*c* and 17*b* are energized by an energizing current which is supplied through the conducting cycloconverter silicon controlled rectifier of Group VI into the terminal end of motor phase winding 17*c* and out of the terminal end of phase winding 17*b* through the conducting cycloconverter silicon controlled rectifier of Group V which completes 360° of motor energization.

FIG. 6, upper portion, diagrammatically represents the number of mechanical degrees of rotation of motor rotor 18 during which each rotor position sensor phototransistor is exposed to the corresponding rotor position sensor light-emitting diode. That is, each of rotor position sensor phototransistors 12 through 15, inclusive, are exposed to the corresponding rotor position sensor light-emitting diodes for 30 mechanical degrees of rotor rotation. The lower portion of FIG. 6 illustrates the number of electrical degrees a gate signal is applied to each Group of cycloconverter silicon controlled rectifiers during 90 mechanical degrees of rotation of rotor 18 which is equivalent to 360 electrical degrees of motor energization. Each Group of cycloconverter silicon controlled rectifiers has gate signals applied thereto during 120 electrical degrees of motor energization.

While the silicon controlled rectifiers receive gate signals during 120 electrical degrees of motor energization in the sequence as illustrated in FIG. 6, lower portion, each cycloconverter silicon controlled rectifier of any of the Groups conducts only a portion of the conduction period as it is reversed poled by the supply potential produced by supply potential alternator 27 which reverses several times during a 120 electrical degree period. Only a slight potential ripple occurs in the rectified potential since the alternator frequency is substantially higher than the operating frequency of motor 17. For example, when motor 17 is of an eight-pole type and is operated at a maximum speed of 9,000 RPM, the motor potential frequency will be 600 cps. The alternator 27 produces a potential of a frequency of the order of 2,700 cps, consequently, at this motor frequency, there are approximately 4½ cycles of alternator supply potential for each complete cycle of motor potential. For a given supply potential alternator output frequency, when the speed of the motor decreases, there is an increase of frequency ratio between the supply potential frequency and the motor energization frequency, a condition which further reduces potential ripple.

While a preferred embodiment of the present invention has been shown and described, it will be obvious to those skilled in the art that various modifications and substitutions may be made without departing from the spirit of the invention which is to be limited only within the scope of the appended claims.

What is claimed is:

1. A cycloconverter silicon controlled rectifier gate-cathode circuit signal and power system comprising in combination with an alternating current motor having polyphase field windings and a rotatable rotor, a supply potential alternating current alternator having a phase output winding for each motor field winding, a cycloconverter network of silicon controlled rectifiers, each having anode, cathode and gate electrodes, of the type having two silicon controlled rectifier groups corresponding to each phase winding of the motor for cyclically energizing the phase windings of the motor from the phase output windings of the supply potential alternator and a source of direct current potential, a rotor position sensor for producing cycloconverter silicon controlled rectifier gate signals, a gate power alternating current alternator having the same number of phase output windings as and a rotor mechanically coupled to said supply potential alternating current alternator for producing a cycloconverter silicon controlled rectifier gate-cathode power potential which leads the supply potential by a selected electrical angle, a gate-cathode circuit for each one of said cycloconverter silicon controlled rectifiers, a zero crossover switch of the type which produces an output signal upon each transition of an input alternating current signal through zero from a negative to a positive polarity included in each one of said gate-cathode circuits, first and second switch means included in each one of said gate-cathode circuits responsive to said cycloconverter silicon controlled rectifier gate signals produced by said rotor position sensor and to the output signal from said zero crossover switch in the same gate-cathode circuit, respectively, for completing the gate-cathode circuit for the corresponding said cycloconverter silicon controlled rectifier, and means for transformer coupling said gate-cathode circuit of each of said cycloconverter silicon controlled rectifiers of each of said silicon controlled rectifier groups to a respective different phase output winding of said gate power alternating current alternator.

2. A cycloconverter silicon controlled rectifier gate-cathode circuit signal and power system comprising in combination with an alternating current motor having polyphase field windings and a rotatable rotor, a supply potential alternating current alternator having a phase output winding for each motor field winding, a cycloconverter network of silicon controlled rectifiers, each having anode, cathode and gate electrodes, of the type having two silicon controlled rectifier groups corresponding to each phase winding of the motor for cyclically energizing the phase windings of the motor from the phase output windings of the supply potential alternator and a source of direct current potential, a plurality of rotor position sensor phototransistors each corresponding to one of said cycloconverter silicon controlled rectifier groups of said cycloconverter network for producing cycloconverter silicon controlled rectifier gate signals, a rotor position sensor light-emitting diode optically coupled to each one of said rotor position sensor phototransistors and connected across said source of direct current potential, a shutter member operated by said rotor of said motor of a configuration such that pairs of said rotor position sensor phototransistors are alternately exposed to and masked from the corresponding said rotor position sensor light-emitting diodes upon the operation thereof, a light-emitting diode corresponding to each said cycloconverter silicon controlled rectifier of said cycloconverter network, means for connecting each said rotor position sensor phototransistor and the said light-emitting diodes which correspond to the cycloconverter silicon controlled rectifiers of the silicon controlled rectifier group of said cycloconverter network to which the said rotor position sensor phototransistor corresponds in series across said source of direct current potential, a gate power alternating current alternator having the same number of phase output windings as and a rotor mechanically coupled to said supply potential alternating current alternator for producing a cycloconverter silicon controlled rectifier gate-cathode power potential which leads the supply potential by a selected electrical angle, a gate-cathode circuit for each one of said cycloconverter silicon controlled rectifiers, a zero crossover switch of the type which produces an output signal upon each transition of an input alternating current signal through zero from a negative to a positive polarity included in each one of said gate-cathode circuits, first and second switch means included in each one of said gate-cathode circuits responsive to said cycloconverter silicon controlled rectifier gate signals produced by said rotor position sensor phototransistors and to the output signal from said zero crossover switch in the same gate-cathode circuit, respectively, for completing the gate-cathode circuit for the corresponding said cycloconverter silicon controlled rectifier, and means for transformer coupling said gate-cathode circuit of each of said cycloconverter silicon controlled rectifiers of each of said silicon controlled rectifier groups to a respective different phase output winding of said gate power alternating current alternator.

3. A cycloconverter silicon controlled rectifier gate-cathode circuit signal and power system comprising in combination with an alternating current motor having polyphase field windings and a rotatable rotor, a supply potential alternating current alternator having a phase output winding for each motor field winding, a cycloconverter network of silicon controlled rectifiers, each having anode, cathode and gate electrodes, of the type having two silicon controlled rectifier groups corresponding to each phase winding of the motor for cyclically energizing the phase windings of the motor from the phase output windings of the supply potential alternator and a source of direct current potential, a plurality of circumferentially arranged rotor position sensor phototransistors each corresponding to one of said cycloconverter silicon controlled rectifier groups of said cycloconverter network for producing cycloconverter silicon controlled rectifier gate signals, a rotor position sensor light-emitting diode axially aligned in optical coupling relationship with and spaced from each one of said rotor position sensor phototransistors and connected across said source of direct current potential, a shutter member disposed between said rotor position sensor phototransistors and said rotor position sensor light-emitting diodes and rotated by said rotor of said motor of a configuration such that pairs of said rotor position sensor phototransistors are alternately exposed to and masked from the corresponding said rotor position sensor light-emitting diodes upon the rotation thereof, a light-emitting diode corresponding to each said cycloconverter silicon controlled rectifier of said cycloconverter network, means for connecting each said rotor position sensor phototransistor and the said light-emitting diodes which correspond to the cycloconverter silicon controlled rectifiers of the silicon controlled rectifier group of said cycloconverter network to which the said rotor position sensor phototransistor corresponds in series across said source of direct current potential, a gate power alternating current alternator having the same number of phase output windings as and a rotor mechanically coupled to said supply potential alternating current alternator for producing a cycloconverter silicon controlled rectifier gate-cathode power potential which leads the supply potential by a selected electrical angle, a gate-cathode circuit for each one of said cycloconverter silicon controlled rectifiers, a zero crossover switch of the type which produces an output signal upon each transition of an input alternating current signal through zero from a negative to a positive polarity included in each one of said gate-cathode circuits, first and second switch means included in each one of said gate-cathode circuits responsive to said cycloconverter silicon controlled rectifier gate-cathode circuit signals produced by said rotor position sensor phototransistors and to the output signal from said zero crossover switch in the same gate-cathode circuit, respectively, for completing the gate-cathode circuit for the corresponding said cycloconverter silicon controlled rectifier, and means for transformer coupling said gate-cathode circuit of each of said cycloconverter silicon controlled rectifiers of each of said silicon controlled rectifier groups to a respective different phase output winding of said gate power alternating current alternator.

4. A cycloconverter silicon controlled rectifier gate-cathode circuit signal and power system comprising in combination with an alternating current motor having polyphase field windings and a rotatable rotor, a supply potential alternating current alternator having a phase output winding for each motor field winding, a cycloconverter network of silicon controlled rectifiers, each having anode, cathode and gate electrodes, of the type having two silicon controlled rectifier groups corresponding to each phase winding of the motor for cyclically energizing the phase windings of the motor from the phase output windings of the supply potential alternator and a source of direct current potential, a plurality of circumferentially arranged rotor position sensor phototransistors each corresponding to one of said cycloconverter silicon controlled rectifier groups of said cycloconverter network for producing cycloconverter silicon controlled rectifier gate signals, a rotor position sensor light-emitting diode axially aligned in optical coupling relationship with and spaced from each one of said rotor position sensor phototransistors and connected across said source of direct current potential, a shutter member disposed between said rotor position sensor phototransistors and said rotor position sensor light-emitting diodes and rotated by said rotor of said motor of a configuration such that pairs of said rotor position sensor phototransistors are alternately exposed to and masked from the corresponding said rotor position sensor light-emitting diodes upon the rotation thereof, a light-emitting diode corresponding to each said cycloconverter silicon controlled rectifier of said cycloconverter network, means for connecting each said rotor position sensor phototransistor and the said light-emitting diodes which correspond to the cycloconverter silicon controlled rectifiers of the silicon controlled rectifier group of said cycloconverter network to which the said rotor position sensor phototransistor corresponds in series across said source of direct current potential, a gate power alternating current alternator having the same number of phase output windings as and a rotor mechanically coupled to said supply potential alternating current alternator for producing a cycloconverter silicon controlled rectifier gate-cathode power potential which leads the supply potential by a selected electrical angle, a gate-cathode circuit for each one of said cycloconverter silicon controlled rectifiers, a light actuated silicon controlled rectifier having two current carrying electrodes connected in series in the said gate-cathode circuit of each of said cycloconverter silicon controlled rectifiers and optically coupled to the one of said light-emitting diodes which corresponds to the same cycloconverter silicon controlled rectifier, a zero crossover switch of the type which produces an output signal upon each transition of an input alternating current signal through zero from a negative to a positive polarity included in each one of said gate-cathode circuits, a gate-cathode circuit silicon controlled rectifier switch having two current carrying electrodes connected in series in each one of said gate-cathode circuits responsive to the output signal from said zero crossover switch in the same gate-cathode circuit for completing the gate-cathode circuit for the corresponding said cycloconverter silicon controlled rectifier, and means for transformer coupling said gate-cathode circuit of each of said cycloconverter silicon controlled rectifiers of each of said silicon controlled rectifier groups to a respective different phase output winding of said gate power alternating current alternator.

5. A cycloconverter silicon controlled rectifier gate-cathode circuit signal and power system comprising in combination with an alternating current motor having polyphase field windings and a rotatable rotor, a supply potential alternating current alternator having a phase output winding for each motor field winding, a cycloconverter network of silicon controlled rectifiers, each having anode, cathode and gate electrodes, of the type having two silicon controlled rectifier groups corresponding to each phase winding of the motor for cyclically energizing the phase windings of the motor from the phase output windings of the supply potential alternator and a source of direct current potential, a plurality of circumferentially arranged rotor position sensor phototransistors each corresponding to one of said cycloconverter silicon controlled rectifier groups of said cycloconverter network for producing cycloconverter silicon controlled rectifier gate signals, a rotor position sensor light-emitting diode axially aligned in optical coupling relationship with and spaced from each one of said rotor position sensor phototransistors and connected across said source of direct current potential, a shutter member having a plurality of equally spaced and circumferentially arranged apertures disposed between said rotor position sensor phototransistors and said rotor position sensor light-emitting diodes and rotated by said rotor of said motor whereby pairs of said rotor position sensor phototransistors are alternately exposed to and masked from the corresponding said rotor position sensor light-emitting diodes upon the rotation thereof, a light-emitting diode corresponding to each said cycloconverter silicon controlled rectifier of said cycloconverter network, means for connecting each said rotor position sensor phototransistor and the said light-emitting diodes which correspond to the cycloconverter silicon controlled rectifiers of the silicon controlled rectifier group of said cycloconverter network to which the said rotor position sensor phototransistor corresponds in series across said source of direct current potential, a gate power alternating current alternator having the same number of phase output windings as and a rotor mechanically coupled to said supply potential alternating current alternator for producing a cycloconverter silicon controlled rectifier gate-cathode power potential which leads the supply potential by a selected electrical angle, a gate-cathode circuit for each one of said cycloconverter silicon controlled rectifiers, a light actuated silicon controlled rectifier having two current carrying electrodes connected in series in the said gate-cathode circuit of each of said cycloconverter silicon controlled rectifiers and optically coupled to the one of said light-emitting diodes which corresponds to the same cycloconverter silicon controlled rectifier, a zero crossover switch of the type which produces an output signal upon each transition of an input alternating current signal through zero from a negative to a positive polarity included in each one of said gate-cathode circuits, a gate-cathode circuit silicon controlled rectifier switch having two current carrying electrodes connected in series in each one of said gate-cathode circuits responsive to the output signal from said zero crossover switch in the same gate-cathode circuit for completing the gate-cathode circuit for the corresponding said cycloconverter silicon controlled rectifier, and means for transformer coupling said gate-cathode circuit of each of said cycloconverter silicon controlled rectifiers of each of said silicon controlled rectifier groups to a respective different phase output winding of said gate power alternating current alternator.

* * * * *